US011212948B1

(12) United States Patent
Snyder et al.

(10) Patent No.: US 11,212,948 B1
(45) Date of Patent: Dec. 28, 2021

(54) THERMAL MANAGEMENT SYSTEM FOR TIGHTLY CONTROLLING TEMPERATURE OF A THERMAL LOAD

(71) Applicant: Rolls-Royce North American Technologies Inc., Indianapolis, IN (US)

(72) Inventors: Douglas J. Snyder, Carmel, IN (US); Timothy Unton, Avon, IN (US)

(73) Assignee: ROLLS-ROYCE NORTH AMERICAN TECHNOLOGIES INC., Indianapolis, IN (US)

( * ) Notice: Subject to any disclaimer, the term of this patent is extended or adjusted under 35 U.S.C. 154(b) by 0 days.

(21) Appl. No.: 17/196,700

(22) Filed: Mar. 9, 2021

(51) Int. Cl.
  *G06F 1/16* (2006.01)
  *H05K 5/00* (2006.01)
  *H05K 7/00* (2006.01)
  *H05K 7/20* (2006.01)

(52) U.S. Cl.
  CPC ..... *H05K 7/20945* (2013.01); *H05K 7/20881* (2013.01); *H05K 7/20936* (2013.01); *B64D 2221/00* (2013.01)

(58) Field of Classification Search
  CPC .......... H05K 7/20945; H05K 7/20881; H05K 7/20936; B64D 2221/00
  See application file for complete search history.

(56) References Cited

U.S. PATENT DOCUMENTS

| | | | | |
|---|---|---|---|---|
| 5,507,150 A | * | 4/1996 | Weber | B64D 13/00 62/100 |
| 10,578,369 B1 | * | 3/2020 | Johnson | F28D 15/06 |
| 2012/0324933 A1 | * | 12/2012 | Louvar | H05K 7/20327 62/196.4 |
| 2013/0074530 A1 | * | 3/2013 | Piesker | F25B 1/00 62/115 |
| 2014/0137581 A1 | * | 5/2014 | Cho | F25B 23/006 62/119 |
| 2016/0298883 A1 | * | 10/2016 | Louvar | H05K 7/20827 |
| 2019/0257245 A1 | | 8/2019 | Duge et al. | |
| 2019/0316850 A1 | * | 10/2019 | Snyder | F28F 27/02 |
| 2019/0360730 A1 | * | 11/2019 | Hagh | F25B 40/00 |

(Continued)

OTHER PUBLICATIONS

U.S. Appl. No. 16/611,932, filed Nov. 8, 2019, Jansen.

*Primary Examiner* — Anthony M Haughton
(74) *Attorney, Agent, or Firm* — Crowell & Moring LLP

(57) ABSTRACT

A thermal management system for tightly controlling temperature of a thermal load (e.g., onboard an aircraft) includes: a pressurized tank for storing an expendable coolant; a control valve downstream of the pressurized tank for controlling a flow rate of the expendable coolant; a heat exchanger downstream of the control valve for transferring heat from a thermal load to the expendable coolant at a predetermined temperature; a back pressure regulator (BPR) downstream of the heat exchanger, the BPR having a set point controlled to maintain the expendable coolant at the predetermined temperature in the heat exchanger; optionally, a sensor or orifice downstream of the heat exchanger for determining vapor quality at an exit of the heat exchanger; and a system exit downstream of the BPR for removing some or all of the expendable coolant from the thermal management system after transferring heat from the thermal load to the expendable coolant.

20 Claims, 2 Drawing Sheets

(56) References Cited

U.S. PATENT DOCUMENTS

2020/0025082 A1    1/2020  Karam et al.
2020/0102894 A1    4/2020  Duge et al.
2020/0363101 A1   11/2020  Jansen \* cited by examiner

THERMAL MANAGEMENT SYSTEM FOR TIGHTLY CONTROLLING TEMPERATURE OF A THERMAL LOAD

TECHNICAL FIELD

This disclosure relates generally to cooling systems and more specifically to a blowdown tank system for providing thermal management.

BACKGROUND

The design of thermal management systems to cool thermal loads aboard aircraft may be wrought with challenges. Some thermal loads require cooling below ambient temperature conditions; therefore, simple heat rejection to an ambient heat sink may not be an option. In such cases, a thermal lift system (e.g., a refrigeration system) may be deemed beneficial or essential. However, thermal lift systems have several components (e.g., compressor, condenser, evaporator) that may be large, heavy, and/or consume substantial amounts of power. In addition, certain thermal loads have rigid temperature control requirements. A thermal management system suitable for an aircraft is preferably light and compact, with a capability of providing tight temperature control and supporting both high power thermal loads and variable thermal loads that operate at low to medium duty cycles.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The thermal management system and method described in this disclosure may provide an alternative to a thermal lift system to effect cooling below ambient temperature conditions, e.g., onboard an aircraft and in other applications. The system and method can provide a finite amount of cooling to a thermal load by utilizing an expendable coolant stored in a pressurized tank. As will be discussed below, after blowdown from the tank, the expendable coolant may be expanded through a valve to a reduced pressure such that the coolant can vaporize at a target temperature suitable for cooling the load. The ability for heat transfer to occur through boiling or evaporation of the expendable coolant may enable large heat transfer coefficients that can facilitate efficient cooling. Furthermore, the phase change in the expendable coolant may permit a nearly isothermal heat sink for the thermal load. The isothermal condition and the ability to set the heat transfer temperature by controlling pressure, as described below, may enable tight temperature control at the thermal load. The phase change may also allow for a significant reduction in the amount of expendable coolant required for cooling. In the proposed embodiments, after absorbing heat from the thermal load, some or all of the expendable coolant may be dumped overboard from the aircraft, burned (alone or with another fluid) if additional power production or thrust is required, and/or reacted with other compounds to convert the fluid to a safer compound.

Figure 1:
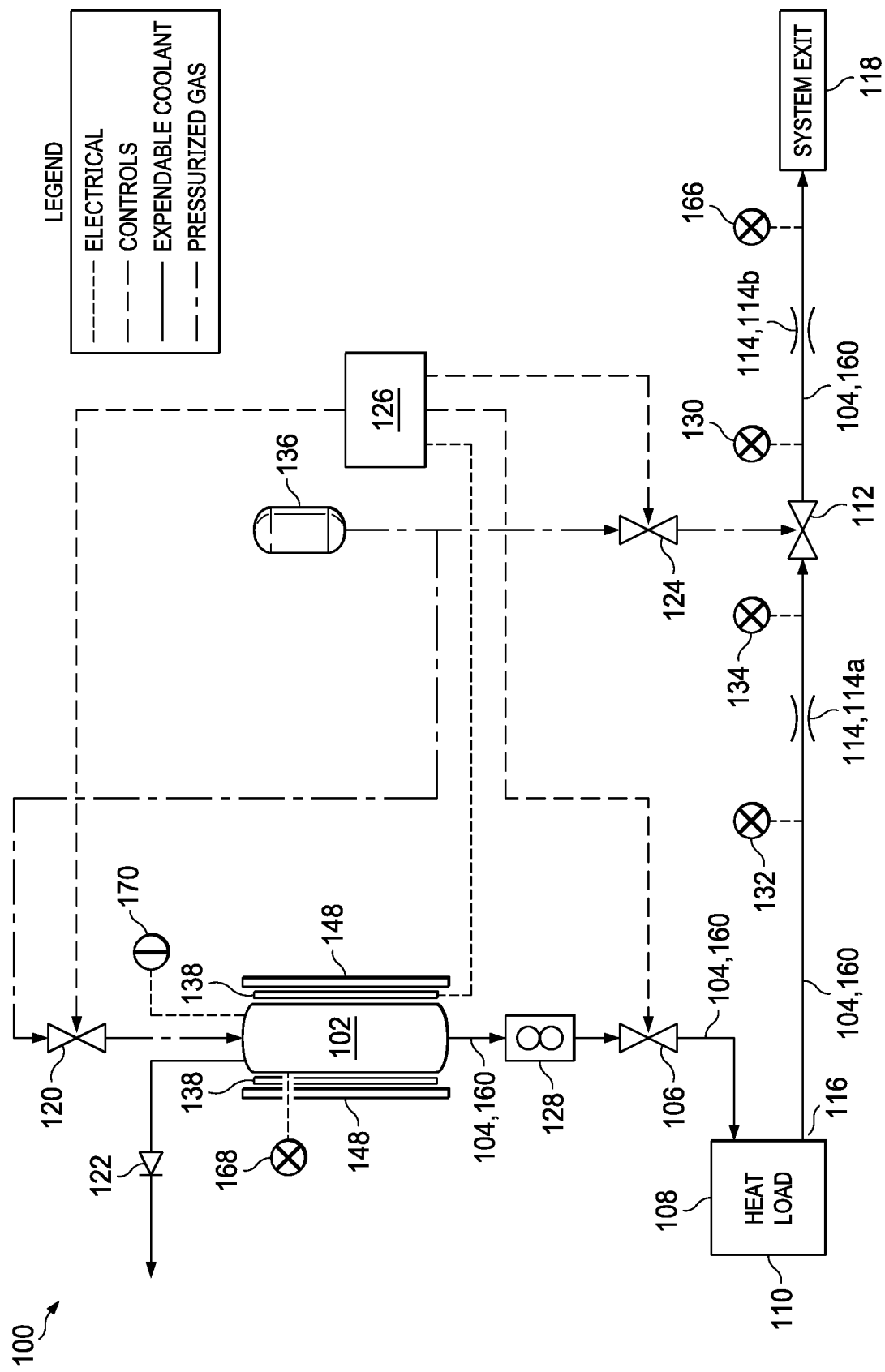
FIG. 1 shows a first embodiment of the thermal management system.

Referring now to FIG. 1, a first embodiment of the thermal management system 100 for tightly controlling temperature of a thermal load onboard an aircraft may include the following components in fluid communication: a pressurized tank 102 for storing an expendable coolant 104; a control valve 106 downstream of the pressurized tank 102 for controlling a flow rate of the expendable coolant 104; a heat exchanger 108 downstream of the control valve 106 for transferring heat from a thermal load 110 to the expendable coolant 104 at a predetermined temperature; a back pressure regulator (BPR) 112 downstream of the heat exchanger 108 that has a set point configured to maintain the expendable coolant 104 at the predetermined temperature in the heat exchanger 108; a sensor or orifice 114 downstream of the heat exchanger 108 for determining vapor quality of the expendable coolant 104 at an exit 116 of the heat exchanger 108; and a system exit 118 downstream of the BPR 112 for removing some or all of the expendable coolant 104 from the thermal management system after transferring heat from the thermal load 110 to the expendable coolant 104. Components described as being in fluid communication may be understood to be interconnected, e.g., using suitable lengths of pipe or tubing and associated connectors, along a cooling path 160 such that fluid (e.g., the expendable coolant 104) can flow between and/or through the components.

The thermal management system 100 may also include a power and thermal management controller ("controller") 126 connected to various components as shown in FIG. 1 to provide electrical power and/or control. For example, the controller 126 may send a signal to the control valve 106 based on the vapor quality at or near the exit 116 of the heat exchanger 108 in order to control the flow rate of the expendable coolant 104 into the heat exchanger 108. Ideally, the flow rate is sufficient to ensure adequate cooling of the thermal load 110 without using excess expendable coolant 104, such that the size and weight of the pressurized tank 102 can be minimized. A constant flow rate may be suitable for a constant thermal load 110, but may waste significant amounts of the coolant 104 if the thermal load 110 is variable and/or if none of the expendable coolant 104 is reclaimed. On the other hand, in some applications, it may be desirable to "overflow" the expendable coolant 104 beyond what is strictly necessary for cooling if, for instance, the expendable coolant 104 is subsequently being burned to generate power, and more power is needed. The thermal management system 100 described in this disclosure can permit this type of operation and still supply the expendable coolant 104 to the thermal load 110 at the predetermined temperature.

The thermal load 110 may be any device or machine that operates within a narrow temperature range and needs to be maintained within that temperature range (i.e., at or near a nominal temperature) regardless of the ambient temperature. As discussed further below, the predetermined temperature of the expendable coolant may refer to a targeted temperature or range of temperatures such that, as heat is transferred from the thermal load 110 to the expendable coolant 104 in the heat exchanger 108, the expendable coolant undergoes evaporation to maintain the thermal load 110 at or near the nominal temperature, which may be constant or variable. In one example, the thermal load 110 comprises one or more laser diodes. In other examples, the thermal load 110 may comprise one or more power electronic devices, system controllers/avionics, electric machines, gyrotrons, magnetrons, and/or other fluid circuits such as oil, dielectrics, hydraulics or air. The thermal management system may be configured such that the heat exchanger 108 is in thermal contact with the thermal load 110; in other words, the heat exchanger 108 may be either in direct physical contact with the thermal load 110 or in contact via one or more intervening components or layers through which heat can be transferred. The heat exchanger 108 may have any configuration suitable for transferring heat from the thermal load 110 to the expendable coolant 104. For example, the heat exchanger 108 may take the form of a cold plate (or parallel arrangement of cold plates) including internal channels for flow of the expendable coolant 104 therethrough and comprising one or more external surfaces onto which the thermal load 110 may be mounted.

The pressurized tank 102 stores the expendable coolant 104 before it is delivered into the heat exchanger 108. Suitable fluids for the expendable coolant 104 may include, for example, ammonia, R1233rd, $CO_2$, hydrogen, ethane, and/or CF3I. Depending on specific requirements, the use of other fluids may be possible. The pressurized tank 102 may be pressurized by a gas such as nitrogen, air, or a combustion product in order to force the expendable coolant 104 through and ultimately out of the system 100 (e.g., to be dumped overboard 166). A pump is therefore not required to induce flow of the expendable coolant 104 through the thermal management system. As shown in FIG. 1, a gas cylinder 136 containing a pressurized gas, such as nitrogen, may be in fluid communication with the pressurized tank 102, e.g., via the first regulator 120. The flow of pressurized gas through the first regulator 120 may be determined by the controller 126. The pressurized tank 102 may include a pressure relief valve 122 to avoid reaching dangerously high pressures within the tank 102 that could lead to tank rupture. A liquid level sensor 168 may be used to monitor the amount of expendable coolant 104 remaining in the tank 102.

During operation of the system 100 shown in FIG. 1, the pressurized tank 102 may be held within a fairly tight temperature range such that, when the pressure of the expendable coolant 104 is decreased in the control valve 106, the expendable coolant 104 preferably comprises saturated liquid or slightly subcooled liquid. A fluid (e.g., the expendable coolant 104) which comprises saturated liquid may be understood to be entirely liquid (100 vol. %) but would begin to vaporize, boil or change phase if any additional heat were added to the fluid. The saturation temperature of the fluid is related to the pressure of the fluid. An expendable coolant 104 which comprises a slightly subcooled liquid may be understood to be entirely liquid at a temperature slightly below (such as within $-10°$ C., $-5°$ C., $-2°$ C., or $-1°$ C. of) the saturation temperature of that liquid, as defined by the liquid's pressure. In the heat exchanger 108, the pressure of the expendable coolant 104 may be controlled such that boiling occurs at a targeted temperature (the "predetermined temperature" mentioned above) in order to maintain the thermal load 110 within a predetermined temperature tolerance (e.g., $+/-5°$ C., $+/-3°$ C., $+/-1°$ C., or $+/-0.5°$ C.) and thus at or near the nominal temperature. The requisite control can be achieved using the back pressure regulator (BPR) 112 or other suitable valve as shown in FIG. 1. As indicated above, the set point for the BPR 112 may be controlled to maintain the proper pressure and hence temperature of the expendable coolant 104 in the heat exchanger 108. The gas cylinder 136 mentioned above may be in fluid communication with the BPR 112, e.g., via the second regulator 124 shown in FIG. 1. The flow of pressurized gas (e.g., $N_2$) through the second regulator 124 may be controlled to provide the desired pressure reference or set point.

Figure 2:
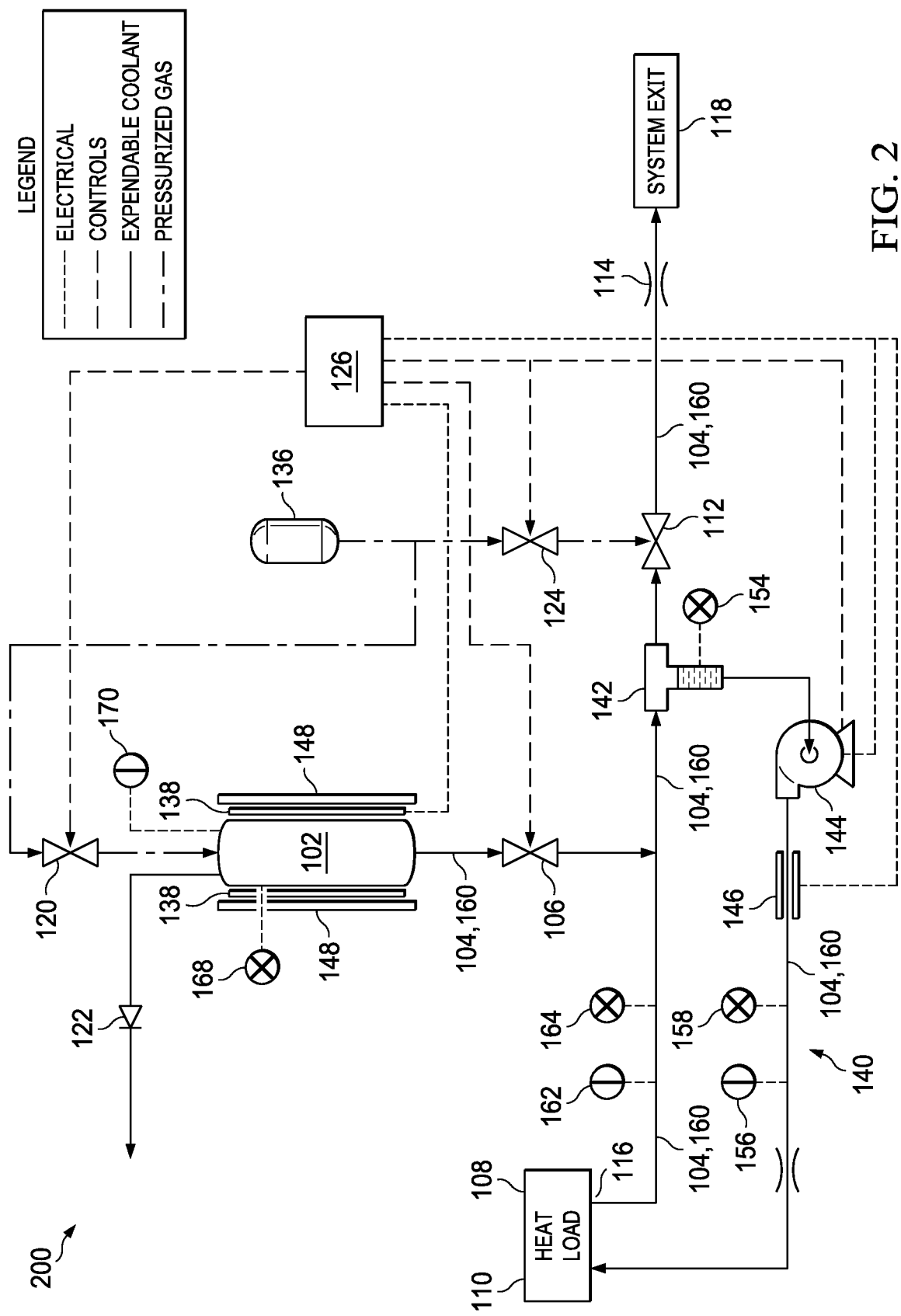
FIG. 2 is shows a second embodiment of the thermal management system.

In order to keep the pressurized tank 102 at a suitable temperature in the first embodiment, such as within $-10°$ C., $-5°$ C., $-2°$ C., or $-1°$ C. of the predetermined temperature (and/or in a pressurized state as may be desired in the second embodiment of FIG. 2), the pressurized tank 102 may be externally heated or cooled. For example, a heater mat 138 powered by electricity may partially or completely surround the tank 102. The pressurized tank 102 may also or alternatively be partly or completely surrounded by insulation 148. In another example, the tank 102 may be cooled by an externally supplied coolant or by expanding some of the expendable coolant 104 from the pressurized tank 102 to a lower pressure and then passing the colder expanded coolant along the outer surface of the tank 102. It is also contemplated that pre-flight operations may reduce cooling and/or heating requirements of the pressurized tank 102. For example, prior to operation of the thermal management system 100, a coolant may be circulated through the entire system 100 (e.g., by a ground cart) to bring the system 100 to a desired temperature prior to operation. In such a case, the circulated fluid would typically be reclaimed by the ground cart instead of dumped overboard. Once the system 100 has reached the desired temperature, the pressurized tank 102 may be filled with the expendable coolant 102 at the required temperature. Due to the significant thermal mass of the pressurized tank 102, the temperature of the tank 102 may be sufficiently stable to not require a heater mat or a cooling mechanism. A temperature gauge 170 may be employed to monitor the temperature of the pressurized tank 102.

A flow meter or simple orifice 128 may be used to measure the flow rate of the expendable coolant 104 from the pressurized tank 102. As mentioned above, a sensor or orifice 114 is positioned downstream of the heat exchanger 108 for determining the vapor quality of the expendable coolant 104 at an exit 116 of the heat exchanger 108. If the vapor quality deviates from a predetermined value or range of values (e.g., 0.4 to 0.6, 0.8 to 1, or whatever value or range is desired for the particular situation) or the fluid is superheated, the flow rate of the expendable coolant 104 through the control valve 106 and into the heat exchanger may be modified. For example, if the vapor quality is too high, then the control valve 106 may be adjusted to increase the flow rate of the expendable coolant 104. If, on the other hand, the vapor quality is too low, then the control valve 106 may be adjusted to reduce the flow rate of the expendable coolant 104. The controller 126 electrically connected to the control valve 106 sends a signal to open or close the valve 106 based on the vapor quality measurements from the sensor or orifice 114. The sensor may be a vapor quality sensor, such as a commercially available vapor quality sensor from HB Products A/S (Hasselager, Denmark).

If an orifice 114 is used to determine the state of the expendable coolant 104, the orifice 114 may be positioned upstream or downstream of the BPR 112. The vapor quality may be determined based on the pressure drop across the orifice 114 in conjunction with the upstream flow rate. For example, the orifice 114 may be an exit orifice 114b positioned at or near the system exit 118 where the expendable coolant 102 is released (e.g., dumped overboard). The pressure sensors 130,166 can provide the pressure drop across the exit orifice 114b so the vapor quality at the exit 116 of the heat exchanger 108 can be estimated and provided to the controller 126 for adjustment of the control valve 106. In a second example, the orifice may be a post-heat load orifice 114*a* positioned between the exit 116 of the heat exchanger 108 and the BPR 112. In this case, pressure sensors 132,134 upstream and downstream, respectively, of the post-heat load orifice 114*a* may be used to determine the pressure drop across the post-heat load orifice 114*a* and, with knowledge of the upstream flow rate, the vapor quality at the exit of the heat exchanger 108 can be estimated and provided to the controller 126 for adjustment of the control valve 106.

As illustrated in FIG. 1, the controller 126 may be electrically connected to and/or in communication with multiple components of the thermal management system 100. The controller 126 may be any device that performs logic operations. The controller 126 may be in communication with a memory. The controller 23 may include a general processor, a central processing unit, a server device, an application specific integrated circuit (ASIC), a digital signal processor, a field programmable gate array (FPGA), a digital circuit, an analog circuit, a microcontroller, any other type of processor, or any combination thereof.

The thermal management system 100 may further include a recirculation loop 140 downstream of the control valve 106 for recirculating a liquid portion 104*l* of the expendable coolant 104, as described below in regard to FIG. 2. The recirculation loop 140 may include the heat exchanger 108 for transferring heat from the thermal load 110 to the expendable coolant 104 at the predetermined temperature; a liquid/vapor separator 142 for recirculating the liquid portion 104*l* of the expendable coolant 104 and removing a vapor portion 104*v* of the expendable coolant 104; and a recirculation pump 144 downstream of the liquid/vapor separator 142 for delivering the liquid portion 104*l* of the expendable coolant 104 to the heat exchanger 108 to absorb heat from the thermal load 110 and partially vaporize to a two-phase coolant. In this case, the BPR 112 is downstream of the liquid/vapor separator 142 and downstream of the recirculation loop 140, and the BPR 112 has a set point controlled to maintain the two-phase coolant at the predetermined temperature in the heat exchanger 108. The system exit 118 is downstream of the recirculation loop 140 for removing the vapor portion 104*v* of the expendable coolant 104 from the thermal management system 100. If the recirculation loop 140 is added to the thermal management system 100 shown in FIG. 1, the sensor or orifice 114 downstream of the heat exchanger 108 for determining vapor quality of the expendable coolant 104 may not be required. Advantages of including the recirculation loop 140 in the thermal management system 100 are discussed below in regard to FIG. 2.

In addition to the above-described thermal management system 100, a method of tightly controlling temperature of a thermal load onboard an aircraft is described in reference to FIG. 1.

The method includes transporting an expendable coolant 104 along a cooling path 160 comprising: a pressurized tank 102; a control valve 106 downstream of the pressurized tank 102; a heat exchanger 108 in thermal contact with a thermal load 110 to be kept at a predetermined temperature, the heat exchanger 108 being downstream of the control valve 106; a BPR 112 downstream of the heat exchanger 108; and a system exit 118 downstream of the BPR 112.

The transporting of the expendable coolant 104 includes a first step of flowing the expendable coolant 104 from the pressurized tank 102 through the control valve 106 at a modifiable flow rate, where the expendable coolant 104, after passing through the control valve 106, preferably comprises saturated liquid or slightly subcooled liquid. Ideally, the pressurized tank 102 is maintained at a temperature within −10° C., −5° C., −2° C., or −1° C. of the predetermined temperature. The expendable coolant 104 comprising the saturated liquid or slightly subcooled liquid is flowed into the heat exchanger 108, where the coolant 104 absorbs heat from the thermal load 110 at the predetermined temperature and partially vaporizes. Vapor quality of the expendable coolant 104 is measured after the coolant 104 exits the heat exchanger 108 (e.g., using the sensor or orifice 114 discussed above). If the vapor quality deviates from a predetermined quality, the control valve 106 is adjusted to modify the flow rate of the expendable coolant 104 into the heat exchanger 108. The expendable coolant 104 is flowed from the heat exchanger 108 through the BPR 112. The pressure of the expendable coolant 104 is measured upstream of the BPR 112, and, if the pressure deviates from a predetermined pressure, the set point of the BPR 112 is adjusted to maintain the expendable coolant 104 at the predetermined temperature in the heat exchanger 108. After passing through the BPR 112, the expendable coolant 104 flows through a system exit 118 for removal from the cooling path 160. Advantageously, the method allows the amount of the expendable coolant 104 being transported along the cooling path 160 to be minimized, if desired, while keeping the thermal load 110 at the predetermined temperature. As discussed above, it may be advantageous to control the flow rate of the coolant 104 into the heat exchanger 108 such that just enough coolant 104 is used to ensure adequate cooling of the thermal load 110, thereby allowing the size and weight of the pressurized tank 102 to be minimized. On the other hand, in some applications, it may be desirable to "overflow" the expendable coolant 104 beyond what is strictly necessary for cooling, e.g., if the expendable coolant 104 is subsequently being burned to generate power.

FIG. 2 shows a second embodiment of the thermal management system 200. The recirculation loop 140 referred to above is included and incorporates additional components into the thermal management system 200. Because part of the expendable coolant 104 is reclaimed and recirculated in this embodiment, the pressurized tank 102 may be made smaller and/or the temperature and flow rate of the expendable coolant 104 from the pressurized tank 102 need not be so tightly controlled as in the first embodiment 100.

Referring to FIG. 2, the second embodiment 200 comprises: a pressurized tank 102 for storing an expendable coolant 104; a control valve 106 downstream of the pressurized tank 102 for controlling a flow rate of the expendable coolant 104; and a recirculation loop 140 downstream of the control valve 106 for recirculating the expendable coolant 104. The control valve 106 allows for control over the flow rate of the coolant 104 into the recirculation loop 140. The recirculation loop 140 includes: a heat exchanger 108 for transferring heat from a thermal load 110 to the expendable coolant 104 at a predetermined temperature; a liquid/vapor separator 142 for reclaiming a liquid portion 104*l* of the expendable coolant 104 ("or coolant liquid 104*l*") and removing a vapor portion 104*v* of the expendable coolant 104 (or "coolant vapor 104*v*"); and a recirculation pump 144 downstream of the liquid/vapor separator 142 for delivering the liquid portion 104*l* to the heat exchanger 108 to absorb heat from the thermal load 110 and partially vaporize to a two-phase coolant. It should be noted that, within the recirculation loop 140, the expendable coolant 104 may comprise coolant liquid 104*l* or a two-phase coolant, depending on where in the loop 140 the coolant 104 is. As indicated above, the coolant vapor 104*v* is removed from the recirculation loop 140 by the liquid/vapor separator 142. The thermal management system 200 also includes a BPR 112 downstream of the liquid/vapor separator 142 and the recirculation loop 140; and a system exit 118 downstream of the recirculation loop 140 and the BPR 112 through which the coolant vapor 104v exits the thermal management system 200. The BPR 112 may have a set point configured to maintain the two-phase coolant at the predetermined temperature in the heat exchanger 108. The thermal management system 200 also includes a power and thermal management controller ("controller") 126 connected to various components as shown in FIG. 2 to provide electrical power and/or control, as described above in regard to FIG. 1.

The components (e.g., pressurized tank 102, expendable coolant 104, heat exchanger 108, back pressure regulator 112, etc.) of the second embodiment of the thermal management system 200 may include any or all of the characteristics and/or functions described above for these components in regard to the first embodiment 100.

A unique element of the second embodiment of the system 200 is the recirculation loop 140, which advantageously allows the liquid portion 104l of the expendable coolant 104 to be reclaimed after exiting the heat exchanger 108 for recirculation through the thermal load 110. For example, if the vapor quality of the two-phase coolant 104 exiting the heat exchanger 108 is 0.5 (i.e., 50% of the expendable coolant 104 is in the vapor phase and 50% is in the liquid phase) the recirculation loop 140 can reclaim 50% of the expendable coolant 104 while 50% exits the system 200 to be dumped overboard 166 or burned. Thus, the required volume of the pressurized tank 102 may be decreased by a significant amount, such as by 50% or more.

In addition, the recirculation loop 140 may provide a means to warm the system 200 up on a cold day. The pump 144 may be turned on to circulate coolant through the heat exchanger 108 without dumping coolant overboard, and with optional additional heating elements in the recirculation loop 140, the system 200 may be rapidly heated up. Another benefit is that control over the flow rate of the expendable coolant 104 into the heat exchanger 108 may be less critical because unvaporized liquid is reclaimed and not dumped overboard, and consequently excess flow may be provided into the recirculation loop 140 with a negligible system weight penalty.

An orifice 114 may be positioned downstream of the heat exchanger 108 and the recirculation loop 140 to keep the pressure higher than ambient in order to make the coolant vapor 104v more dense. This may allow the line from the BPR 112 to the system exit 118 to be made smaller in diameter and therefore lower in weight. A level sensor 154 may be incorporated into the liquid/vapor separator 142, and feedback from the level sensor 154 may be used to adjust (open or close) the control valve 106 in order to maintain an acceptable liquid level in the liquid/vapor separator 142.

In addition to the liquid/vapor separator 142, the pump 144, and the heat exchanger 108, the recirculation loop 140 may further comprise a temperature and/or pressure sensor 156,158 and a heater 146 downstream of the recirculation pump 144 for ensuring proper subcooling of the coolant liquid 104l prior to entering the heat exchanger 108.

As in the first embodiment, the BPR 112 may have a set point selected to target a particular pressure and hence saturation temperature of the expendable coolant 104 in the heat exchanger 108. However, the temperature of the pressurized tank 102 need not be firmly controlled due to the presence of the recirculation loop 140. In other words, the pressurized tank 102 of the second embodiment may not need to be maintained at a temperature within −10° C., −5° C., −2° C., or −1° C. of the predetermined temperature, as in the first embodiment. If the pressurized tank 102 is hotter than the targeted saturation temperature, some portion of the expendable coolant 104 that enters the recirculation loop 140 from the control valve 106 may be converted to vapor (coolant vapor 104v) upon passing through the control valve 106. After passing through the liquid/vapor separator 142, the the coolant vapor 104v exits the recirculation loop 140 without reaching the heat exchanger 108, where two-phase flow could lead to flow maldistribution and thus inhibit proper heat transfer from the thermal load 110. If the pressurized tank 102 is sufficiently warm, then the vapor pressure in the tank 102 may be high enough such that the gas cylinder 136 is not needed. If, on the other hand, the pressurized tank 102 is colder than the targeted saturation temperature, the expendable coolant 104 entering the recirculation loop 140 may induce condensation of some fraction of the partly vaporized coolant 104 exiting the heat exchanger 108; thus, when the merged stream of coolant 104 reaches the liquid/vapor separator 142, a reduced amount of coolant vapor 104v may exit the system 200. In such a situation, components downstream of the liquid/vapor separator 142 may be made smaller. The pressurized tank 102 may also or alternatively be made smaller because the colder expendable coolant 104 can absorb more heat before it begins to change to vapor in the heat exchanger 108.

Since the pressurized tank 102 can better withstand variability in its temperature in the second embodiment 200, it may be possible to eliminate active pressurization of the tank 102 and allow the tank 102 to self-pressurize by heating it to a temperature higher than the desired saturation temperature of the coolant 104 in the heat exchanger 108, as indicated above. A larger pressurized tank 102 may be required in this case, but overall, the system 200 may be made smaller and lighter because the gas cylinder 136 could be made smaller.

In addition the above-described thermal management system 200, a method of tightly controlling temperature of a thermal load onboard an aircraft is described in reference to FIG. 2.

The method comprises transporting an expendable coolant 104 along a cooling path 160 comprising: a pressurized tank 102; a control valve 106 downstream of the pressurized tank 102; a recirculation loop 140 downstream of the control valve 106, the recirculation loop 140 comprising: a heat exchanger 108 in thermal contact with a thermal load 110 to be kept at a predetermined temperature, a liquid/vapor separator 142, and a recirculation pump 144; a BPR 112 downstream of the liquid/vapor separator 142 and the recirculation loop 140; and a system exit 118 downstream of the BPR 112. The transporting comprises flowing the expendable coolant 104 from the pressurized tank 102 through the control valve 106 at a modifiable flow rate and into the recirculation loop 140. The expendable coolant 104 may comprise saturated liquid, slightly subcooled liquid or a two-phase fluid, since as explained above, the temperature requirements on the coolant 104 are not as stringent as in the first embodiment. The expendable coolant 104 is flowed through the liquid/vapor separator 142 for separation into a coolant liquid 104l and a coolant vapor 104v, the latter of which is expelled from the recirculation loop 140. The coolant liquid 104l is pumped into the heat exchanger 108 to absorb heat from the thermal load 110 at the predetermined temperature and partially vaporize into a two-phase coolant before being recirculated through the recirculation loop 142. The coolant vapor 104v flows from the recirculation loop 140 through the BPR 112 and then passes through the system exit 118.

The pressure of the expendable coolant 104 is measured upstream of the BPR 112, and, if the pressure deviates from a predetermined pressure, the set point of the BPR 112 may be adjusted to maintain the two-phase coolant at the predetermined temperature (e.g., saturation temperature) in the heat exchanger 108. FIG. 2 shows exemplary temperature and pressure sensors 162,164 near the exit 116 of the heat exchanger 108. Also or alternatively, a liquid level of a level sensor 152 in the liquid/vapor separator 142 may be monitored; if the liquid level deviates from a predetermined level, the control valve 106 may be adjusted to modify the flow rate of the expendable coolant 104 into the recirculation loop 142.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed. Unless otherwise indicated or the context suggests otherwise, as used herein, "a" or "an" means "at least one" or "one or more."

While various embodiments have been described, it will be apparent to those of ordinary skill in the art that many more embodiments and implementations are possible. Accordingly, the embodiments described herein are examples, not the only possible embodiments and implementations.

The subject-matter of the disclosure may also relate, among others, to the following aspects:

A first aspect relates to a thermal management system for tightly controlling temperature of a thermal load (e.g., onboard an aircraft), the thermal management system comprising components in fluid communication, the components comprising: a pressurized tank for storing an expendable coolant; a control valve downstream of the pressurized tank for controlling a flow rate of the expendable coolant; a heat exchanger downstream of the control valve for transferring heat from a thermal load to the expendable coolant at a predetermined temperature; a back pressure regulator (BPR) downstream of the heat exchanger, the BPR having a set point controlled to maintain the expendable coolant at the predetermined temperature in the heat exchanger; and a system exit downstream of the BPR for removing some or all of the expendable coolant from the thermal management system after transferring heat from the thermal load to the expendable coolant.

A second aspect relates to the thermal management system of the first aspect, wherein the components further comprise: a sensor or orifice downstream of the heat exchanger for determining vapor quality at an exit of the heat exchanger.

A third aspect relates to the thermal management system of the second aspect, wherein, during operation, the control valve is adjusted to control the flow rate of the expendable coolant based on the vapor quality at or near the exit of the heat exchanger.

A fourth aspect relates to the thermal management system of any preceding aspect, further comprising a heater mat surrounding the pressurized tank for maintaining the pressurized tank within −10° C. of the predetermined temperature and/or in a pressurized state.

A fifth aspect relates to the thermal management system of any preceding aspect, further comprising a gas cylinder containing a pressurized gas in fluid communication with the BPR and/or the pressurized tank.

A sixth aspect relates to the thermal management system of any preceding aspect, wherein the sensor comprises a vapor quality sensor.

A seventh aspect relates to the thermal management system of any preceding aspect, wherein the orifice is disposed upstream of the BPR.

An eighth aspect relates to the thermal management system of any preceding aspect, wherein the orifice is disposed downstream of the BPR.

A ninth aspect relates to the thermal management system of any preceding aspect, further comprising a flow meter between the pressurized tank and the control valve.

A tenth aspect relates to the thermal management system of any preceding aspect, wherein the thermal load includes one or more laser diodes, power electronic devices, system controllers/avionics, electric machines, gyrotrons, magnetrons, and/or other fluid circuits.

An eleventh aspect relates to the thermal management system of any preceding aspect, further comprising a controller electrically connected to one or more of the components to provide electrical power and/or control.

A twelfth aspect relates to the thermal management system of any preceding aspect, further comprising a recirculation loop downstream of the control valve for recirculating a liquid portion of the expendable coolant, the recirculation loop including: the heat exchanger for transferring heat from the thermal load to the expendable coolant at the predetermined temperature; a liquid/vapor separator for recirculating a liquid portion of the expendable coolant and removing a vapor portion of the expendable coolant; and a recirculation pump downstream of the liquid/vapor separator for delivering the liquid portion of the expendable coolant to the heat exchanger to absorb heat from the thermal load and partially vaporize to a two-phase coolant, wherein the BPR is downstream of the liquid/vapor separator and the recirculation loop, the BPR having a set point controlled to maintain the two-phase coolant at the predetermined temperature in the heat exchanger; and wherein the vapor portion of the expendable coolant is removed from the thermal management system through the system exit.

A thirteenth aspect relates to the thermal management system of the twelfth aspect, wherein the recirculation loop further comprises a temperature and/or pressure sensor and a heater mat downstream of the recirculation pump for ensuring proper subcooling of the liquid portion of the expendable coolant prior to entry into the heat exchanger.

A fourteenth aspect relates to the thermal management system of the twelfth or thirteenth aspect, wherein the recirculation loop further comprises a level sensor in the liquid/vapor separator, and, wherein, during operation, the control valve is adjusted to modify the flow rate of the expendable coolant into the recirculation loop based on a liquid level in the level sensor A fifteenth aspect relates to a method of tightly controlling temperature of a thermal load (e.g., onboard an aircraft), the method comprising: transporting an expendable coolant along a cooling path including: a pressurized tank; a control valve downstream of the pressurized tank; a heat exchanger in thermal contact with a thermal load to be kept at a predetermined temperature, the heat exchanger being downstream of the control valve; a back pressure regulator (BPR) downstream of the heat exchanger; and a system exit downstream of the BPR, wherein the transporting comprises: flowing the expendable coolant from the pressurized tank through the control valve at a modifiable flow rate, the expendable coolant comprising saturated liquid or slightly subcooled liquid; flowing the expendable coolant into the heat exchanger to absorb heat from the thermal load at the predetermined temperature, the expendable coolant partially vaporizing; measuring vapor quality of the expendable coolant after the expendable coolant exits the heat exchanger, and, if the vapor quality deviates from a predetermined quality, adjusting the control valve to modify the flow rate of the expendable coolant into the heat exchanger; measuring pressure of the expendable coolant upstream of the BPR, and, if the pressure deviates from a predetermined pressure, adjusting a set point of the BPR to maintain the expendable coolant at the predetermined temperature in the heat exchanger; and flowing the expendable coolant from the heat exchanger through the BPR and out the system exit.

A sixteenth aspect relates to the method of the fifteenth aspect, wherein a volume of the expendable coolant being transported along the cooling path is minimized while the thermal load is kept at the predetermined temperature.

A seventeenth aspect relates to the method of the fifteenth or sixteenth aspects, wherein the pressurized tank is maintained a temperature within −10° C. ° C. of the predetermined temperature.

An eighteenth aspect relates to the method of any of the fifteenth through the seventeenth aspects, wherein the cooling path further comprises a sensor or orifice downstream of the heat exchanger for measuring the vapor quality.

A nineteenth aspect relates to a method of tightly controlling temperature of a thermal load (e.g., onboard an aircraft), the method comprising: transporting an expendable coolant along a cooling path including: a pressurized tank; a control valve downstream of the pressurized tank; a recirculation loop downstream of the control valve, the recirculation loop comprising: a heat exchanger in thermal contact with a thermal load to be kept at a predetermined temperature, a liquid/vapor separator, and a recirculation pump; a back pressure regulator (BPR) downstream of the liquid/vapor separator and the recirculation loop; and a system exit downstream of the BPR, wherein the transporting comprises: flowing the expendable coolant from the pressurized tank through the control valve at a modifiable flow rate and into the recirculation loop; flowing the expendable coolant into the liquid/vapor separator for separation into a liquid portion and a vapor portion; pumping the liquid portion into the heat exchanger to absorb heat from the thermal load at the predetermined temperature, the expendable coolant partially vaporizing to a two-phase coolant before being transported back to the liquid/vapor separator; measuring pressure of the expendable coolant upstream of the BPR, and, if the pressure deviates from a predetermined pressure, adjusting a set point of the BPR to maintain the two-phase coolant at the predetermined temperature in the heat exchanger; and flowing the vapor portion from the recirculation loop through the BPR and out the system exit.

A twentieth aspect relates to the method of the nineteenth aspect, further comprising monitoring a liquid level of a level sensor in the liquid/vapor separator, and, if the liquid level deviates from a predetermined level, adjusting the control valve to modify the flow rate of the expendable coolant into the recirculation loop.

In addition to the features mentioned in each of the independent aspects enumerated above, some examples may show, alone or in combination, the optional features mentioned in the dependent aspects and/or as disclosed in the description above and shown in the figures.

What is claimed is:

1. A thermal management system for tightly controlling temperature of a thermal load, the thermal management system comprising components in fluid communication, the components comprising:
    a pressurized tank for storing an expendable coolant;
    a control valve downstream of the pressurized tank for controlling a flow rate of the expendable coolant;
    a heat exchanger downstream of the control valve for transferring heat from a thermal load to the expendable coolant at a predetermined temperature;
    a back pressure regulator (BPR) downstream of the heat exchanger, the BPR having a set point controlled to maintain the expendable coolant at the predetermined temperature in the heat exchanger; and
    a system exit downstream of the BPR for removing some or all of the expendable coolant from the thermal management system after transferring heat from the thermal load to the expendable coolant.

2. The thermal management system of claim 1, wherein the components further comprise a sensor or orifice downstream of the heat exchanger for determining vapor quality at an exit of the heat exchanger.

3. The thermal management system of claim 2, wherein, during operation, the control valve is adjusted to control the flow rate of the expendable coolant based on the vapor quality at the exit of the heat exchanger.

4. The thermal management system of claim 1, further comprising a heater mat surrounding the pressurized tank for maintaining the pressurized tank within −10° C. of the predetermined temperature and/or in a pressurized state.

5. The thermal management system of claim 1, further comprising a gas cylinder containing a pressurized gas in fluid communication with the BPR and/or the pressurized tank.

6. The thermal management system of claim 1, wherein the sensor comprises a vapor quality sensor.

7. The thermal management system of claim 1, wherein the orifice is disposed upstream of the BPR.

8. The thermal management system of claim 1, wherein the orifice is disposed downstream of the BPR.

9. The thermal management system of claim 1, further comprising a flow meter between the pressurized tank and the control valve.

10. The thermal management system of claim 1, wherein the thermal load includes one or more laser diodes, power electronic devices, system controllers/avionics, electric machines, gyrotrons, magnetrons, and/or other fluid circuits.

11. The thermal management system of claim 1, further comprising a controller electrically connected to one or more of the components to provide electrical power and/or control.

12. The thermal management system of claim 1, further comprising a recirculation loop downstream of the control valve for recirculating a liquid portion the expendable coolant, the recirculation loop including:
    the heat exchanger for transferring heat from the thermal load to the expendable coolant at the predetermined temperature;
    a liquid/vapor separator for recirculating the liquid portion of the expendable coolant and removing a vapor portion of the expendable coolant; and a recirculation pump downstream of the liquid/vapor separator for delivering the liquid portion of the expendable coolant to the heat exchanger to absorb heat from the thermal load and partially vaporize to a two-phase coolant, wherein the BPR is downstream of the liquid/vapor separator and the recirculation loop, the BPR having a set point controlled to maintain the two-phase coolant at the predetermined temperature in the heat exchanger;

wherein the vapor portion of the expendable coolant is removed from the thermal management system through the system exit.

13. The thermal management system of claim 12, wherein the recirculation loop further comprises a temperature and/or pressure sensor and a heater downstream of the recirculation pump for ensuring proper subcooling of the liquid portion of the expendable coolant prior to entry into the heat exchanger.

14. The thermal management system of claim 12, wherein the recirculation loop further comprises a level sensor in the liquid/vapor separator, and wherein, during operation, the control valve is adjusted to modify the flow rate of the expendable coolant into the recirculation loop based on a liquid level in the level sensor.

15. A method of tightly controlling temperature of a thermal load, the method comprising:

transporting an expendable coolant along a cooling path including: a pressurized tank; a control valve downstream of the pressurized tank; a heat exchanger in thermal contact with a thermal load to be kept at a predetermined temperature, the heat exchanger being downstream of the control valve; a back pressure regulator (BPR) downstream of the heat exchanger; and a system exit downstream of the BPR, wherein the transporting comprises:

flowing the expendable coolant from the pressurized tank through the control valve at a modifiable flow rate, the expendable coolant comprising saturated liquid or slightly subcooled liquid;

flowing the expendable coolant into the heat exchanger to absorb heat from the thermal load at the predetermined temperature, the expendable coolant partially vaporizing;

measuring vapor quality of the expendable coolant after the expendable coolant exits the heat exchanger, and, if the vapor quality deviates from a predetermined quality, adjusting the control valve to modify the flow rate of the expendable coolant into the heat exchanger;

measuring pressure of the expendable coolant upstream of the BPR, and, if the pressure deviates from a predetermined pressure, adjusting a set point of the BPR to maintain the expendable coolant at the predetermined temperature in the heat exchanger; and flowing the expendable coolant from the heat exchanger through the BPR and out the system exit.

16. The method of claim 15, wherein a volume of the expendable coolant being transported along the cooling path is minimized while the thermal load is kept at the predetermined temperature.

17. The method of claim 15, wherein the pressurized tank is maintained a temperature within −10° C. of the predetermined temperature.

18. The method of claim 15, wherein the cooling path further comprises a sensor or orifice downstream of the heat exchanger for measuring the vapor quality.

19. A method of tightly controlling temperature of a thermal load, the method comprising:

transporting an expendable coolant along a cooling path including: a pressurized tank; a control valve downstream of the pressurized tank; a recirculation loop downstream of the control valve, the recirculation loop comprising: a heat exchanger in thermal contact with a thermal load to be kept at a predetermined temperature, a liquid/vapor separator, and a recirculation pump; a back pressure regulator (BPR) downstream of the liquid/vapor separator and the recirculation loop; and a system exit downstream of the BPR, wherein the transporting comprises:

flowing the expendable coolant from the pressurized tank through the control valve at a modifiable flow rate and into the recirculation loop;

flowing the expendable coolant into the liquid/vapor separator for separation into a liquid portion and a vapor portion;

pumping the liquid portion into the heat exchanger to absorb heat from the thermal load at the predetermined temperature, the expendable coolant partially vaporizing to a two-phase coolant before being transported back to the liquid/vapor separator;

measuring pressure of the expendable coolant upstream of the BPR, and, if the pressure deviates from a predetermined pressure, adjusting a set point of the BPR to maintain the two-phase coolant at the predetermined temperature in the heat exchanger; and flowing the vapor portion from the recirculation loop through the BPR and out the system exit.

20. The method of claim 19, further comprising monitoring a liquid level of a level sensor in the liquid/vapor separator, and, if the liquid level deviates from a predetermined level, adjusting the control valve to modify the flow rate of the expendable coolant into the recirculation loop.

* * * * *